United States Patent
Ludwig et al.

(10) Patent No.: US 7,122,434 B2
(45) Date of Patent: Oct. 17, 2006

(54) METHOD FOR GENERATING AN ELECTRICAL CONTACT WITH BURIED TRACK CONDUCTORS

(75) Inventors: Christoph Ludwig, Langebruck (DE); Klaus-Dieter Morhard, Dresden (DE); Christoph Kutter, Dresden (DE)

(73) Assignee: Infineon Technologies AG, (DE)

( * ) Notice: Subject to any disclaimer, the term of this patent is extended or adjusted under 35 U.S.C. 154(b) by 0 days.

(21) Appl. No.: 11/124,726

(22) Filed: May 9, 2005

(65) Prior Publication Data

US 2005/0201131 A1 Sep. 15, 2005

Related U.S. Application Data

(62) Division of application No. 10/159,859, filed on May 31, 2002, now Pat. No. 6,909,153.

(30) Foreign Application Priority Data

Jun. 6, 2001 (DE) ................................ 101 27 350

(51) Int. Cl.
*H01L 21/8234* (2006.01)
(52) U.S. Cl. ...................... 438/275; 438/278
(58) Field of Classification Search ................ 438/275, 438/278, 279
See application file for complete search history.

(56) References Cited

U.S. PATENT DOCUMENTS

| 5,149,665 | A | 9/1992 | Lee |
| 6,114,767 | A | 9/2000 | Nagai et al. |
| 6,545,306 | B1 | 4/2003 | Kim et al. |
| 6,566,699 | B1 | 5/2003 | Eitan |
| 2001/0028092 | A1* | 10/2001 | Lowrey et al. ............. 257/390 |
| 2002/0190292 | A1 | 12/2002 | Karasawa et al. |

* cited by examiner

*Primary Examiner*—Phat X. Cao
(74) *Attorney, Agent, or Firm*—Altera Law Group LLC; Jeffrey R. Stone

(57) ABSTRACT

A semiconductor structure 300 comprises a plurality of first track conductors 303, a plurality of second track conductors 304, which are insulated with respect to the first track conductors 303 and form a grid together with these first track conductors 303, and a plurality of third track conductors 307 parallel above the first track conductors 303, which third track conductors 307 partly cover the second track conductors 304 and are insulated with respect thereto, in which semiconductor structure 300, between in each case two adjacent second track conductors 304, there is located an electrical contact 305 between each first track conductor 303 and the corresponding third track conductor 307 which lies above it.

6 Claims, 3 Drawing Sheets

FIG 1
Prior Art
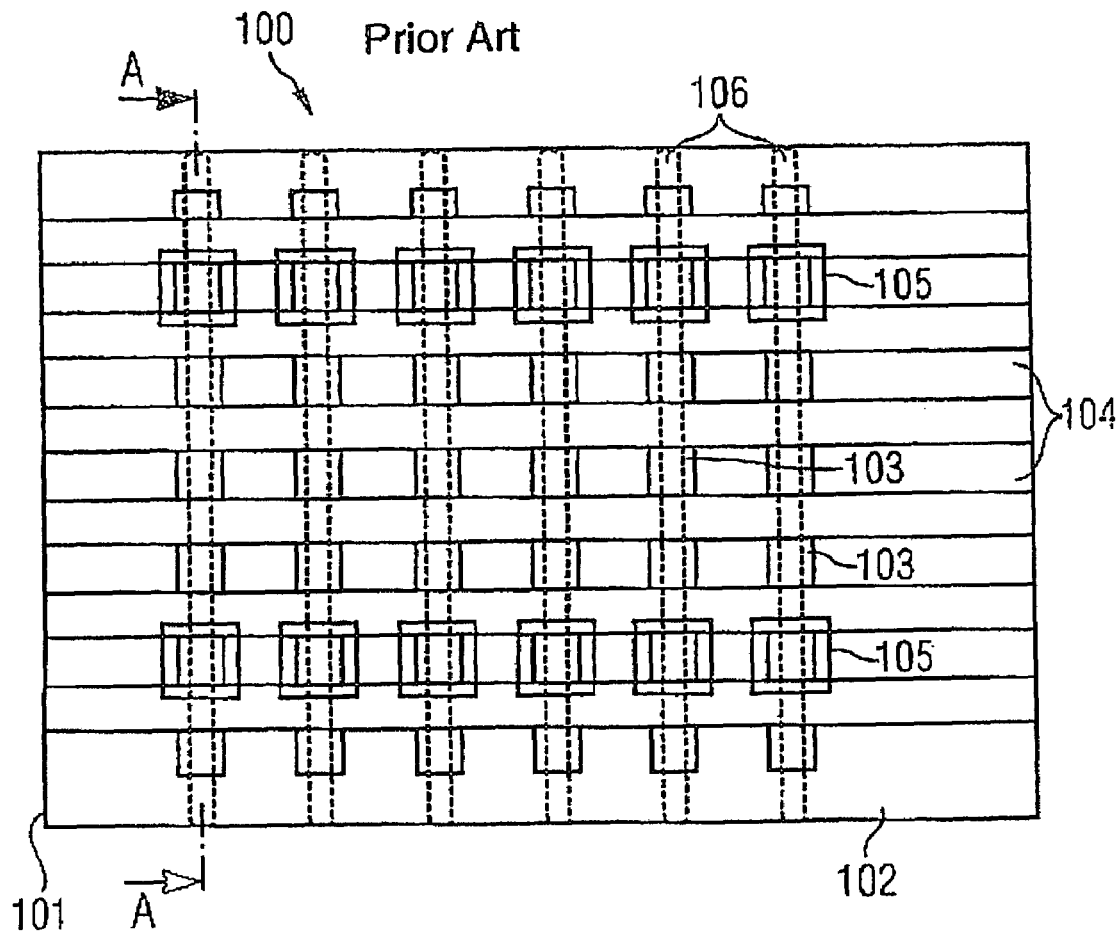
FIG 2 A-A
Prior Art
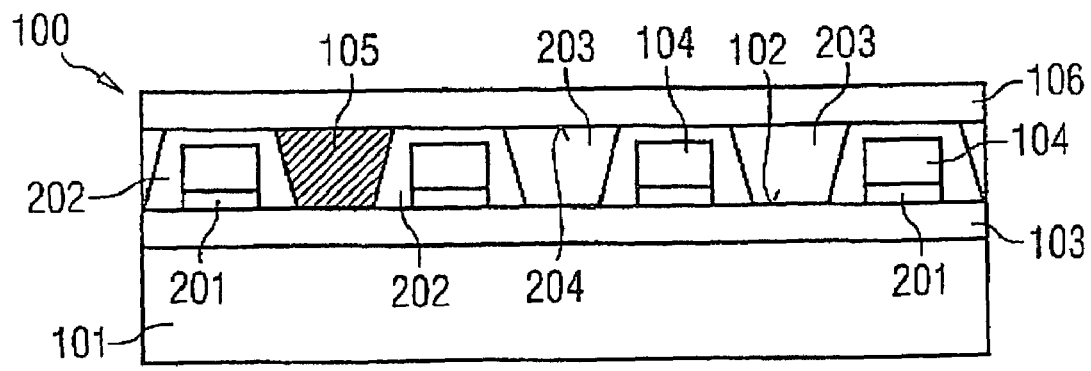

B-B

C-C

METHOD FOR GENERATING AN ELECTRICAL CONTACT WITH BURIED TRACK CONDUCTORS

This application is a divisional of U.S. patent application Ser. No. 10/159,859, filed May 31, 2002, now U.S. Pat. No. 6,909,153 which claims priority to German Patent Application Number 101 27 350.9, filed Jun. 6, 2001.

BACKGROUND OF THE INVENTION

The invention relates to a semiconductor structure having buried track conductors and to a method for generating an electrical contact with buried track conductors.

According to the prior art, memory cell arrangements, for example flash memories, are produced as large matrix-like memory arrays comprising transistors. A certain arrangement of track conductors is required both for storage and to read out the memory cells. To optimize the space required, some of the track conductors are diffused into a semiconductor substrate as buried bit lines. However, diffused-in bit lines have the problem that the electrical resistances of the diffused-in bit lines are higher than the electrical resistances of track conductors in metallization levels.

The RC time constant which results from the level of the resistances of the diffused-in bit lines consequently limits the signal propagation time. The term signal propagation time is to be understood as meaning the time required to write to memory cells or to read them out. According to the prior art, to reduce the signal propagation time in each case one metallic track conductor is used in parallel to the diffused-in bit lines. These metallic track conductors are electrically connected to the diffused-in bit lines at regular intervals by means of contacts, known as stitch contacts. This allows the resistance of the diffused-in bit lines and therefore the signal propagation time to be resistance of the diffused-in bit lines and therefore the signal propagation time to be reduced. For clarification, FIG. 1 and FIG. 2 show a semiconductor structure which represents a memory cell arrangement of this type.

FIG. 1 shows a top view of a semiconductor structure 100 in accordance with the prior art.

In a semiconductor substrate 101, a group of first track conductors 103 is integrated at a substrate surface 102. The first track conductors 103 are arranged parallel and next to one another and end substantially flush with the substrate surface 102. The first track conductors 103 are usually produced by means of diffusion of electrically conductive ions into the semiconductor substrate 101. The first track conductors 103 may, for example, be provided as buried bit lines.

Furthermore, on the substrate surface 102 of the semiconductor substrate 101 there is a group of second track conductors 104, which are arranged parallel and next to one another on the substrate surface 102, electrically insulated with respect to the first track conductors 103. Together with the first track conductors 103, the second track conductors 104 form a regular grid. The second track conductors 104 are usually produced by means of conventional methods for producing metallization levels.

In each case two adjacent first track conductors 103 and one second track conductor 104 which lies above them form a transistor. The two first track conductors 103 act as the two transistor electrodes known as source and drain in the transistor region, for which reason the first track conductors 103 are referred to as bit lines. In the transistor region, the second track conductor 104 acts as the transistor electrode known as gate, for which reason the second track conductors 104 are referred to as word lines.

On the substrate surface 102, in each transistor region an oxide-nitride-oxide layer sequence (not shown) comprising silicon dioxide ($SiO_2$) and silicon nitride ($Si_3N_4$) is located between the first track conductors 103 and below each second track conductor 104, it being possible for up to two bits to be stored in the silicon nitride layer.

To reduce the electrical resistance, the first track conductors 103 are connected to metallic bit lines 106 by means of self-aligning contacts 105. These metallic bit lines 106 run in parallel over the first track conductors 103, bridge the second track conductors 104 and are electrically insulated with respect to the second track conductors 104. Contact is made between the first track conductors 103 and the metallic bit lines 106 in the direction of the metallic bit lines 106 by means of the self-aligning contacts 105 after in each case four second track conductors 104.

FIG. 2 shows a part of a cross section through the semiconductor structure 100 shown in FIG. 1, on section line A—A.

A first insulating layer 201 is located above the substrate surface 102 and therefore above the first track conductors 103, which are integrated in the semiconductor substrate 101. The first insulating layer 201 is intended to provide electrical insulation between the second track conductors 104 and the first track conductors 103. Furthermore, the second track conductors 104 are encapsulated by a second insulating layer 202, and a third insulating layer 203 fills up empty regions between the second track conductors 104, in order to ensure that the second track conductors 104 are electrically insulated with respect to the self-aligning contacts 105 and with respect to the metallic bit lines 106.

The following process sequence is usually employed to produce the self-aligning contacts 105: after the first insulating layer 201 and the second track conductors 104 have been produced, the second track conductors 104 are encapsulated by a second insulating layer 202. For this purpose, first of all an insulating material is deposited over the surface of the second track conductors 104. Then, an etching mask is applied above the second track conductors 104 and the insulating material at exposed locations which are not covered by the etching mask are removed all the way to the substrate surface 102. Then, the etching mask is removed again.

Then, the third insulating layer 203 is produced in the exposed openings between the second track conductors 104. In this case, the material used for the third insulating layer 203 is usually an insulating material which can be etched selectively with respect to the insulating material of the second insulating layer 202. By way of example, silicon nitride ($Si_3N_4$) can be used for the second insulating layer 202 and silicon dioxide ($SiO_2$) for the third insulating layer 203.

To complete production of the self-aligning contacts 105, the third insulating layer 203 is now removed at certain places, and in this way the first track conductors 103 are locally uncovered again. These certain places are then filled with an electrically conductive material, for example tungsten, until the second insulating layer 202, the remaining third insulating layer 203 and the certain places which have been filled with electrically conductive material have a common surface 204 which is parallel to the substrate surface 102. The certain places which have been filled with electrically conductive material now act as self-aligning contacts 105.

In the end, the metallic bit lines 106 are located on the common surface 204 and are required for coupling of electrical signals into the semiconductor structure 100. Furthermore, the metallic bit lines 106 create the possibility of making contact with the integrated first track conductors 103 by means of a plurality of self-aligning contacts 105.

As has already been mentioned above, therefore, to reduce the signal propagation time, in accordance with the prior art in each case one metallic bit line is used in parallel with the diffused-in bit lines. The metallic bit lines are electrically connected to the diffused-in bit lines by means of the self-aligning contacts at intervals of four word lines. The contacts only align themselves perpendicular to the second track conductors.

However, the above-described method for producing the self-aligning contacts does not allow alignment parallel to the second track conductors. Therefore, there is a risk of a contact being produced offset parallel to the second track conductors. An offset contact of this type can lead to electrostatic effects on the semiconductor substrate, which can cause a short circuit between adjacent diffused-in bit lines. A short circuit of this type inevitably leads to failure of the immediately adjacent transistors. It is possible that all the transistors in the relevant bit lines may even be affected by this disturbance. Therefore, when the etching mask is being produced during the production process for each individual contact, the etching mask has to be positioned very accurately, which involves a high level of outlay.

The invention is therefore based on the problem of providing a semiconductor structure and a method for generating an electrical contact, in which the signal propagation times in the semiconductor structure are reduced further and more reliable contact is ensured.

The problem is solved by a semiconductor structure and a method for generating an electrical contact which have the features described in the independent patent claims.

SUMMARY OF THE INVENTION

A semiconductor structure comprises a plurality of first track conductors which run substantially parallel to one another and are provided in a semiconductor substrate. Furthermore, the semiconductor structure comprises a plurality of second track conductors which run substantially parallel to one another, are located on the semiconductor substrate, are insulated with respect to the first track conductors and, together with the first track conductors, form a grid. Moreover, the semiconductor structure comprises a plurality of third track conductors which are arranged substantially parallel above the first track conductors, partially cover the second track conductors and are insulated with respect to the second track conductors. Finally, an electrical contact between each first track conductor and the respective third track conductor lying above it is provided between in each case two adjacent second track conductors.

In a method for generating an electrical contact with a plurality of first track conductors which run substantially parallel to one another and are provided in a semiconductor substrate, a plurality of second track conductors, which run substantially parallel to one another, are applied to the semiconductor substrate in such a manner that the second track conductors, together with the first track conductors, form a grid, and that the second track conductors are insulated with respect to the first track conductors. Furthermore, a plurality of third track conductors are applied substantially parallel above the first track conductors and partly above the second track conductors, electrical insulation being produced between the third track conductors and the second track conductors. Moreover, between in each case two adjacent second track conductors, an electrical contact is produced for generating an electrical contact with the first track conductors between each first track conductor and the respective third track conductor lying above it.

One advantage of the invention can be considered to lie in the fact that the problem of the long signal propagation times in the semiconductor structure is reduced as a result of suitable contact between the first track conductors and the third track conductor which is in each case arranged substantially parallel above it being ensured by means of in each case one contact between in each case two adjacent second track conductors. The contacts which are provided for the respective first track conductor can be produced by means of a single, continuous etching mask which is oriented substantially parallel to the first track conductor.

A further advantage of the invention is that, on account of the large number of contacts, the contacts can be made narrower, in the direction perpendicular to the first track conductors, than the contacts used in the prior art without any increase in the signal propagation time. The narrower contacts mean that, in the semiconductor structure according to the invention the contacts can be produced successfully even if the etching mask position lacks precision. Moreover, if the contact-generating arrangement is structured suitably, it is possible to eliminate a part of the production process, resulting in a significant reduction in the process costs.

Generating a contact with the first track conductors between in each case two adjacent second track conductors also has the advantage that contact is made with all places on each first track conductor in the same way, and that the same electrical properties are present at all places on each first track conductor. Therefore, each first track conductor has the same signal propagation time at all places.

In the semiconductor structure according to the invention, the first track conductors preferably each have a first width and the electrical contacts preferably each have a second width. The two widths are in this case oriented parallel to the first track conductors and perpendicular to the longitudinal direction of the first track conductors. The second width is preferably less than the first width.

In the semiconductor structure according to the invention, a transistor is preferably formed in each case by two adjacent first track conductors and a second track conductor which lies above them. The semiconductor structure according to the invention therefore preferably represents a transistor arrangement.

Furthermore, the semiconductor structure according to the invention preferably comprises an oxide-nitride-oxide layer sequence on the semiconductor substrate, beneath the second track conductor and between adjacent first track conductors.

In a preferred embodiment of the semiconductor structure according to the invention, the transistor, which is in each case formed by two adjacent first track conductors and a second track conductor which lies above them, is a 2-bit memory transistor. This allows the transistor arrangement to be used as a memory cell arrangement.

The electrical contacts of the semiconductor structure according to the invention preferably bridge the second track conductors in an insulated manner. Furthermore, the semiconductor structure according to the invention is preferably formed in such a manner that electrical contacts, which are adjacent above one of the first track conductors, overlap and thereby themselves form the third track conductors. The result is a continuous, connected row of contacts. In this case, there is no need for an independent metallization level in which the third track conductors are arranged. Not only does this reduce the number of layers required on the semiconductor substrate, but also the materials costs of the semiconductor structure according to the invention are reduced.

In a preferred refinement of the method according to the invention, the first track conductors are each produced with a first width and the electrical contacts are each produced with a second width. The two widths are in this case oriented parallel to the first track conductors and perpendicular to the longitudinal direction of the first track conductors. The second width is preferably less than the first width.

The second track conductors are preferably produced above the first track conductors in such a manner that in each case two adjacent first track conductors and a second track conductor lying above them form a transistor. Therefore, a transistor arrangement is preferably produced from the first track conductors and the second track conductors.

It is preferable, before the second track conductors are produced, for an oxide-nitride-oxide layer sequence to be produced on the semiconductor substrate between adjacent first track conductors.

In a preferred refinement of the process according to the invention, the transistor, which is in each case formed by two adjacent first track conductors and a second track conductor which lies above them, is produced in such a manner that it can be used as a 2-bit memory transistor.

It is preferable for the electrical contacts to be formed in such a manner that they bridge the second track conductors and that electrical contacts which are adjacent above one of the first track conductors overlap and thereby themselves form the third track conductors. This makes it possible to dispense with the complex production of an independent metallization level in which the third track conductors are arranged. This firstly reduces the number of process steps required in the production process and secondly therefore reduces the process costs.

Exemplary embodiments of the invention are illustrated in the figures and are explained in more detail below. In the figures, identical reference numerals denote identical components and:

BRIEF DESCRIPTION OF THE DRAWINGS

FIG. 1 shows a top view of a semiconductor structure in accordance with the prior art;

FIG. 2 shows a part of a cross section through the semiconductor structure shown in FIG. 1 on section line A—A;

FIG. 3 shows a top view of a semiconductor structure 300 in accordance with a first exemplary embodiment of the invention.

DETAILED SPECIFICATION

Figure 3:
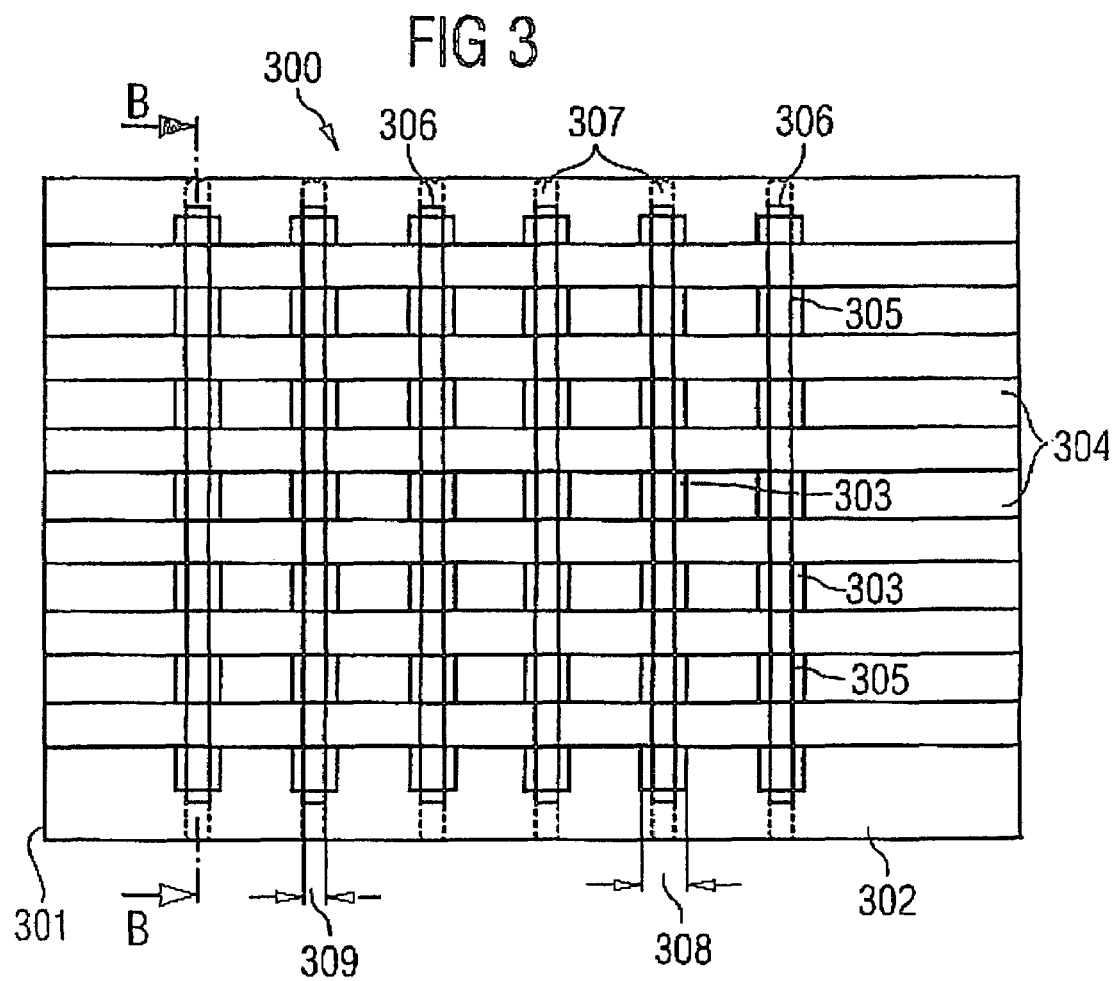
FIG. 3 shows a top view of a semiconductor structure in accordance with a first exemplary embodiment of the invention.

In the first exemplary embodiment of the invention, a group of first track conductors 303 is integrated in a semiconductor substrate 301 at a substrate surface 302. The first track conductors 303 are arranged substantially parallel to one another and end substantially flush with the substrate surface 302. The first track conductors 303 are usually produced by means of diffusion of electrically conductive ions into the semiconductor substrate 301. The first track conductors 303 may be provided, for example, as buried bit lines.

Furthermore, a group of second track conductors 304, which are arranged on the substrate surface 302, substantially parallel to one another and electrically insulated with respect to the first track conductors 303, is located on the substrate surface 302 of the semiconductor substrate 301. The second track conductors 304 form a substantially regular grid together with the first track conductors 303. The second track conductors 304 are usually produced by means of conventional methods for the production of metallization layers.

In each case two adjacent first track conductors 303 and a second track conductor 304 which lies above them form a transistor. In the transistor region, the two first track conductors 304 act as the two transistor electrodes known as source and drain, for which reason the first track conductors 303 are referred to as bit lines. In the transistor region, the second track conductor 304 acts as the transistor electrode known as gate, for which reason the second track conductors 304 are referred to as word lines.

In each transistor region, an oxide-nitride-oxide layer sequence (not shown) comprising silicon dioxide ($SiO_2$) and silicon nitride ($Si_3N_4$) is located between the first track conductors 303 and below each second track conductor 304 on the substrate surface 302, it being possible for up to two bits to be stored in the silicon nitride layer.

The first track conductors 303 are connected to metallic contacting lines 306 by means of self-aligning contacts 305, which metallic contacting lines 306 are in turn coupled to metallic bit lines 307. The metallic contacting lines 306 and the metallic bit lines 307 run substantially parallel over the first track conductors 303, bridge the second track conductors 304 and are electrically insulated with respect to the second track conductors 304. The metallic contacting lines 306 have the purpose of electrically connecting the self-aligning contacts 305 to the metallic bit lines 307.

The first track conductors 303 have a track conductor width 308, and the self-aligning contacts 305 have a contact width 309. Since the contact width 309 is narrower than the track conductor width 308, it is possible to reduce the demands imposed on the accuracy of the contact position during production of the self-aligning contacts 305 compared to the prior art. This considerably reduces the outlay involved in production of the semiconductor structure 300 according to the invention.

Between in each case two adjacent second track conductors 304 there is always one self-aligning contact 305 located between the respective first track conductor 303 and the metallic contacting line 306 above it. According to this exemplary embodiment, the self-aligning contacts 305 and the metallic contacting lines 306 consist of tungsten and are produced in a common metallization process. For this purpose, a protective layer is applied to locations of the semiconductor structure 300 at which locations it is desired that neither self-aligning contacts 305 nor metallic contacting lines 306 are formed. The openings which remain in the protective layer are then filled with metal in order to form the self-aligning contacts 305 and the metallic contacting lines 306. Finally, the protective layer is removed again.

Figure 4:
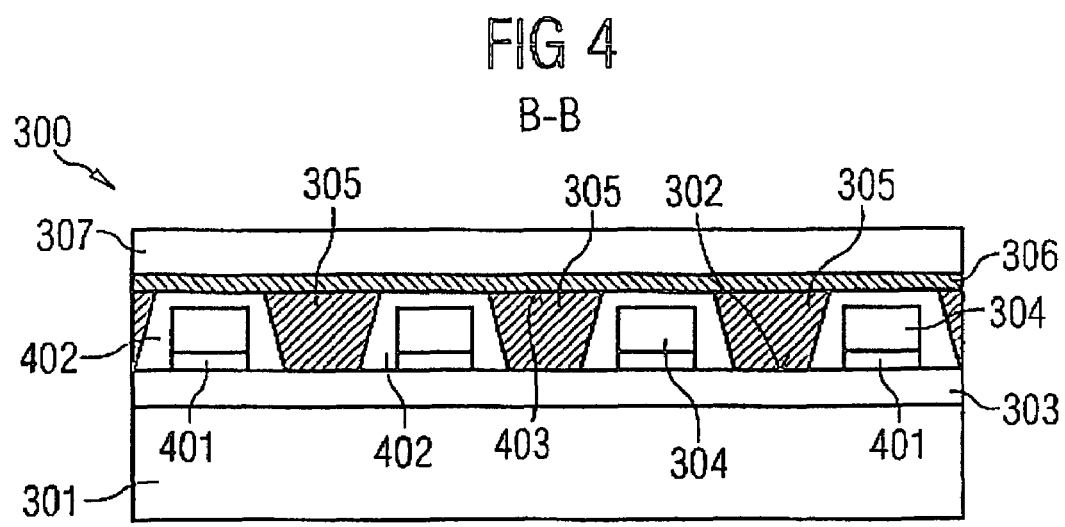
FIG. 4 shows a part of a cross section through the semiconductor structure shown in FIG. 3 on section line B—B.

FIG. 4 shows a part of a cross section through the semiconductor structure 300 shown in FIG. 3 on section line B—B.

Over the substrate surface 302 and therefore above the first track conductors 303 which are integrated in the semiconductor substrate 301, there is located a first insulating layer 401. The first insulating layer 401 is provided for the purpose of electrical insulation between the second track conductors 304 and the first track conductors 303. Furthermore, the second track conductors 304 are encapsulated by a second insulating layer 402, in order to ensure that the second track conductors 304 are electrically insulated with respect to the self-aligning contacts 305 and with respect to the metallic contacting lines 306.

First of all, an insulating material is deposited entirely over the substrate surface 302 and the second track conductors 304 in order to encapsulate the second track conductors 304. Then, an etching mask is applied above the second track conductors 304, covering the second track conductors 304 and a region between adjacent second track conductors 304 which is close to the second track conductors 304. Then, the insulating material is removed down to the substrate surface 302 at exposed locations which are not covered by the etching mask. Then, the etching mask is removed again. In this exemplary embodiment of the invention, silicon nitride ($Si_3N_4$) is used for the second insulating layer 402.

The exposed openings between the second track conductors 304 are then filled with an insulating material which can be etched selectively with respect to the insulating material of the second insulating layer 402. In this exemplary embodiment of the invention, silicon dioxide ($SiO_2$) is used as insulating material between the second track conductors 304.

Then, to produce the self-aligning contacts 305, an etching mask is used for removal of the silicon dioxide ($SiO_2$) in narrow but long regions which are oriented substantially parallel to the first track conductors 303, above the respective first track conductors 303. Both the etching mask and the openings have the desired contact width 309. As a result, the first track conductors 303 are locally uncovered again. The exposed first track conductors 303 are then covered with an electrically conductive material, according to this exemplary embodiment with tungsten, until the electrically conductive material forms a common surface 403, substantially parallel to the substrate surface 302, with the second insulating layer 402.

Then, the openings in the etching mask above the common surface 403 are likewise filled with the electrically conductive material, with the result that the metallic contacting lines 306 are formed. Then, the etching mask can be removed again.

Finally, the metallic bit lines 307 are located on the metallic contacting lines 306, which metallic bit lines 307 are required for coupling the electrical signals into the semiconductor structure 300.

Figure 5:
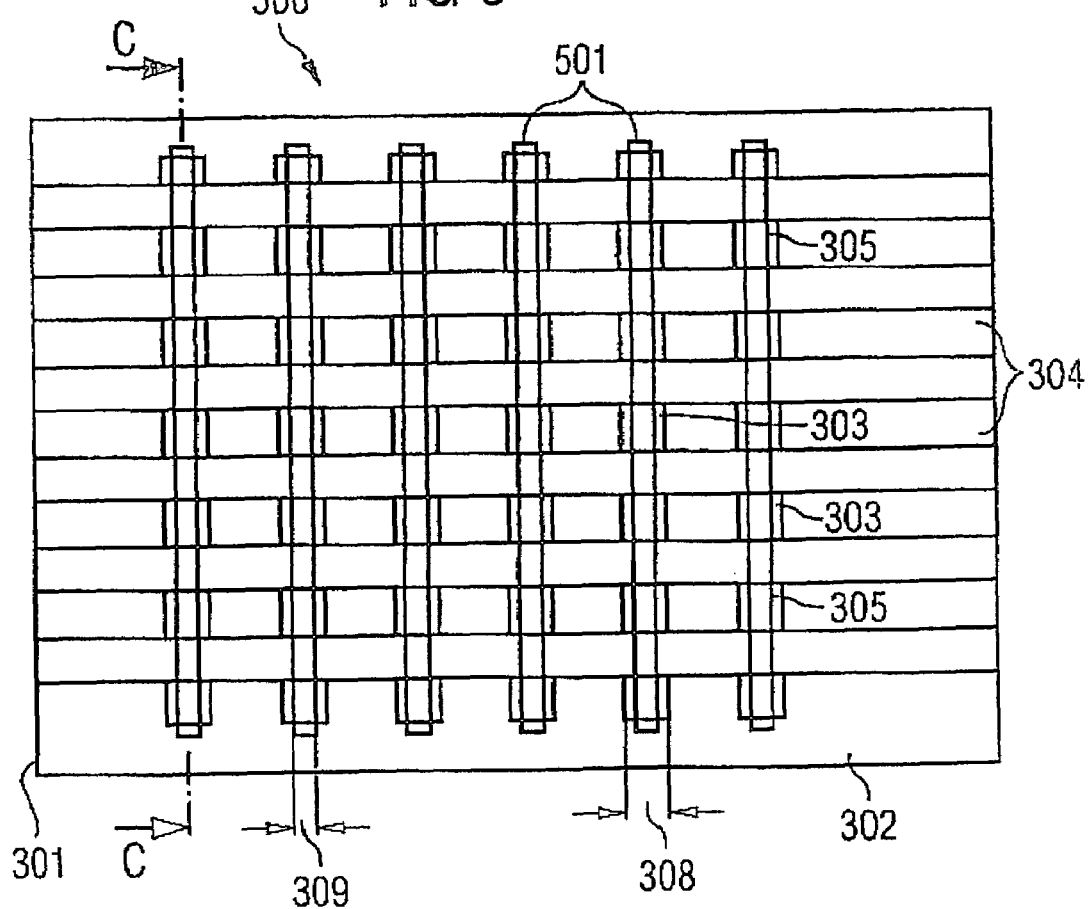
FIG. 5 shows a top view of a semiconductor structure in accordance with a second exemplary embodiment of the invention.

FIG. 5 shows a top view of a semiconductor structure 500 in accordance with a second exemplary embodiment of the invention.

The second exemplary embodiment of the invention differs from the first exemplary embodiment of the invention only through the fact that the metallic contacting lines 306 and the metallic bit lines 307 are combined to form metallic contacting and bit lines 501.

This can be achieved, for example, in the following way: first of all, the etching mask which is required for production of the self-aligning contacts 305 is produced on the semiconductor structure 500 being formed with a thickness which is greater than in the first exemplary embodiment of the invention. If, after the self-aligning contacts 305 have been produced, the openings which remain in the etching mask are then completely filled with the electrically conductive material and the etching mask is removed again, metallic contacting lines 306 are formed and can simultaneously be used as metallic bit lines 307. Consequently, the result is combined metallic contacting and bit lines 501.

The production costs of the semiconductor structure 500 in accordance with the second exemplary embodiment of the invention can be reduced significantly since there is no need for the final metallization level, in which the independent metallic bit lines 307 would be present. This allows the overall production costs to be reduced by up to 10%.

Figure 6:
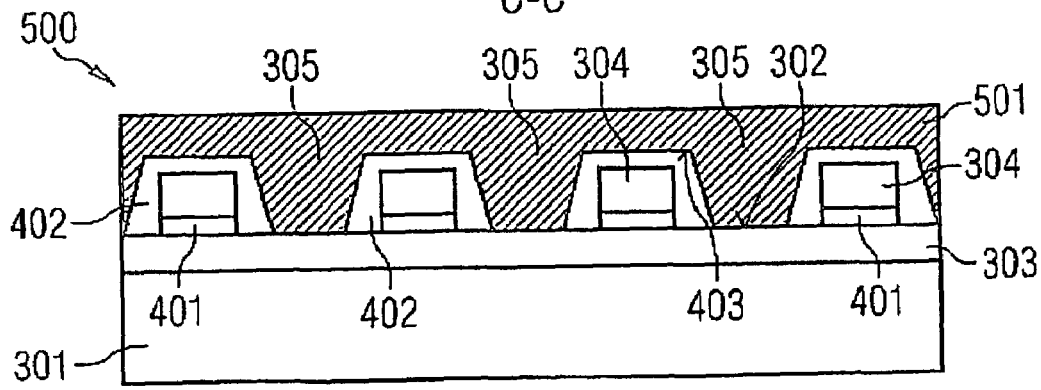
FIG. 6 shows a part of a cross section through the semiconductor structure shown in FIG. 5 on section line C—C.

FIG. 6 shows a part of a cross section through the semiconductor structure 500 shown in FIG. 5 on section line C—C.

This illustration clearly demonstrates the existence of combined metallic contacting and bit lines 501. For further details, reference is made to the description given for FIG. 4.

What is claimed is:

1. Method for generating an electrical contact with a plurality of first track conductors which run substantially parallel to one another and are provided in a semiconductor substrate, the method comprising:
   applying a plurality of second track conductors, which run substantially parallel to one another, to the semiconductor substrate in such a manner that the second track conductors, together with the first track conductors, form a grid, and that the second track conductors are insulated with respect to the first track conductors;
   applying a plurality of third track conductors in a substantially parallel fashion above the first track conductors and partly above the second track conductors, wherein an electrical insulation is produced between the third track conductors and the second track conductors; and
   producing, between each two adjacent second track conductors, an electrical contact for generating an electrical contact with the first track conductors between each first track conductor and the respective third track conductor lying above it.

2. Method according to claim 1, in which the first track conductors are each produced with a first width and the electrical contacts are each produced with a second width, the two widths being oriented parallel to the first track conductors and perpendicular to the longitudinal direction of the first track conductors, and the second width being less than the first width.

3. Method according to claim 1, in which the second track conductors are produced above the first track conductors in such a manner that in each case two adjacent first track conductors and a second track conductor lying above them form a transistor.

4. Method according to claim 1, in which, before the second track conductors are produced, an oxide-nitride-oxide layer sequence is produced on the semiconductor substrate between adjacent first track conductors.

5. Method according to claim 3, in which the transistor is produced in such a manner that it can be used as a 2-bit memory transistor.

6. Method according to claim 1, in which the electrical contacts are formed in such a manner that they bridge the second track conductors and that electrical contacts which are adjacent above one of the first track conductors overlap and thereby themselves form the third track conductors.

* * * * *

UNITED STATES PATENT AND TRADEMARK OFFICE
CERTIFICATE OF CORRECTION

PATENT NO.        : 7,122,434 B2
APPLICATION NO.   : 11/124726
DATED             : October 17, 2006
INVENTOR(S)       : Ludwig et al.

It is certified that error appears in the above-identified patent and that said Letters Patent is hereby corrected as shown below:

On the Title page of the patent, under the listing *(75) Inventors:* please delete " Dresden " and add -- Munchen --; (3rd inventor)

On the Title of the patent, under the listing *(30) Foreign Application Priority Data*, please delete " 101 27 350 " and add -- 101 27 350.9 --.

Signed and Sealed this

Sixteenth Day of October, 2007

JON W. DUDAS
*Director of the United States Patent and Trademark Office*